United States Patent [19]

Song et al.

[11] Patent Number: 5,408,275
[45] Date of Patent: Apr. 18, 1995

[54] APPARATUS AND METHOD FOR CONTROLLING TELEVISION RECEIVER

[75] Inventors: Han B. Song, Kyungsangbook; Jae K. Lee, Daeku, both of Rep. of Korea

[73] Assignee: Goldstar Co., Ltd., Seoul, Rep. of Korea

[21] Appl. No.: 65,256

[22] Filed: May 24, 1993

[30] Foreign Application Priority Data

May 25, 1992 [KR] Rep. of Korea .......... 8871/1992

[51] Int. Cl.$^6$ .................................. H04N 5/44
[52] U.S. Cl. ............................. 348/734; 345/169; 455/151.2
[58] Field of Search .......... 358/194.1, 191.1, 93, 358/83, 86, 311, 335; 455/151.1, 151.2, 154.1; H04N 5/44; 334/8; 340/706, 707, 709, 825.72; 348/734; 345/156, 157, 158, 161, 168, 169

[56] References Cited

U.S. PATENT DOCUMENTS

| | | | |
|---|---|---|---|
| 4,328,578 | 5/1982 | Bell et al. | 455/151.1 |
| 4,375,651 | 3/1983 | Templin et al. | 455/151.1 |
| 4,866,542 | 9/1987 | Shimada et al. | 358/335 |
| 4,965,557 | 10/1990 | Schepers et al. | 358/194.1 |
| 4,996,597 | 2/1991 | Duffield | 348/734 |

FOREIGN PATENT DOCUMENTS

3250456 11/1991 Japan .................. G11B 20/4

Primary Examiner—James J. Groody
Assistant Examiner—Michael H. Lee

[57] ABSTRACT

Apparatus and method for controlling, using a rotary encoder, a television receiver. The remote control unit comprises a keyboard, a rotary encoder controlling the volume and the output level of a selected OSD signal as well as selecting a channel and a position of OSD signal, a remote control microprocessor and a remote signal transmitter. The television receiver unit comprises a remote signal receiver, a microprocessor and a signal processing circuit. The remote control microprocessor checks whether an input signal is a rotary encoder signal and whether the input signal is an increase signal, and operates in accordance with the rotary encoder signal or the corresponding key signal. The microprocessor of the television receiver unit checks whether a rotary encoder signal has been inputted, operates the inputted rotary encoder signal as a channel increase or decrease signal or as a control signal corresponding to a selected on-screen display signal, displays an OSD signal indicative of the output level of the selected OSD signal, and displays the OSD signal on the screen.

1 Claim, 18 Drawing Sheets

APPARATUS AND METHOD FOR CONTROLLING TELEVISION RECEIVER

BACKGROUND OF THE INVENTION

1. Field of the Invention

The present invention relates in general to a television receiver, and more particularly to an apparatus and method for controlling a remote controllable television receiver.

2. Description of the Prior Art

With reference to FIG. 1, there is shown in a block diagram a television set, comprising a remote controllable television receiver unit and a remote control unit, according to the prior art. The television receiver unit is controlled by a remote controller or the remote control unit 1R which comprises a remote control microprocessor 1a, a keyboard 1b and a remote control signal transmitter 1c and outputs a radio signal corresponding to a manually selected channel. The television receiver unit includes a remote signal receiver 2, which receives the channel selecting radio signal outputted from the remote control unit 1R and amplifies the radio signal to a predetermined level and in turn outputs the amplified signal. The television receiver unit further includes a key matrix unit 3, outputting an electric signal of a predetermined level corresponding to a VHF or UHF channel manually selected by the user. A microprocessor 4 is provided in the television receiver unit for outputting, upon receiving the signals outputted from both the remote signal receiver 2 and the key matrix unit 3, a channel increases/decreases signal enabling the selection of a required channel. The microprocessor 4 is connected to a tuner 5 which, upon receiving a broadcast signal inputted by an antenna, tunes and outputs a corresponding broadcast signal according to the output signal of the microprocessor 4. The tuner 5 is connected to an IF/demodulator 6 which IF(intermediate frequency)-processes the output signal of the tuner 5 and demodulates the IF-processed signal. The IF/demodulator 6 is in turn connected to a video signal processing circuit unit 7, which comprises a comb filter 7a, a color processing circuit 7b, a luminance processing circuit 7c, a matrix unit 7d and a CRT drive unit 7e. This video signal processing unit 7 processes only a video signal of the output signals of the IF/demodulator 6 and outputs the processed video signal through a CRT 8. The IF/demodulator 6 is also connected to an audio signal processing circuit 9 which processes only an audio signal of the output signal s of the IF/demodulator 6 and outputs the processed audio signal through a speaker SP. An on-screen code generating circuit 10 is connected between the microprocessor 4 and the CRT drive unit 7e of the video signal processing unit 7. The circuit 10 generates an on-screen code under the control of the microprocessor 4 and outputs the on-screen code to the CRT drive unit 7e for displaying the on-screen code on the CRT 8. The television receiver unit further includes a deflection circuit 11 between the luminance processing circuit 7c, the CRT 8 and the on-screen code generating circuit 10. The deflection circuit 11 separates a synchronous component from the output signal of the luminance processing circuit 7c and deflects, according to the separated synchronous component, the electron beam of an electron gun of the CRT 8.

In the drawing, the block 12 defines a tuning and video/audio processing section of the television receiver unit controlled by a rotary type tuning device while the block 13 defines the construction of the television set controlled by a remote control type tuning device.

Turning to FIG. 2, there is shown in a plan view a keyboard of the conventional remote control unit 1R. On the keyboard, a plurality of numeral keys, respectively numbered 1 to 9 and adapted for selection of channel, are arranged together with a plurality of function keys.

In operation, the matrix unit 3 provided on the television receiver unit or the remote control unit 1R is operated under the condition of powering on the television receiver unit such as for performing the channel selection. A corresponding selection signal is thus outputted from the matrix unit 3 or from the remote control unit 1R to the microprocessor 4 of the television receiver unit. Upon reception of the selection signal, the microprocessor 4 controls the tuner 5 to output a complex video signal, corresponding to a tuned channel, of the broadcast signals inputted by the antenna ANT to the IF/demodulator 6.

Upon receiving the complex video signal, the IF/demodulator 6 separates the video signal of the complex broadcast signals from the audio signal. The audio signal is in turn processed by the audio signal processing circuit 9 and outputted from the speaker SP. The video signal is received by the comb filter 7a wherein the color signal is separated from the luminance signal. The color signal and the luminance signal are processed by the color signal processing circuit 7b and the luminance signal processing circuit 7c, respectively, and transmitted to the CRT drive unit 7e by way of the matrix unit 7d.

In addition, the deflection circuit 11, connected between the luminance processing circuit 7c, the CRT 8 and the on-screen code generating circuit 10, separates the synchronous component from the output signal of the luminance processing circuit 7c. The circuit 11 in turn deflects the electron beam of the electron gun of the CRT 8 according to the separated synchronous component, thereby displaying the picture on the screen of the CRT 8.

At the same time, the on-screen code generating circuit 10 generates a corresponding on-screen display (OSD) signal, which is displayed on the CRT 8, under the control of the microprocessor 4.

In order to change the channel, at least two numeral keys of the remote control unit 1R corresponding to the required channel are manually pushed so as to directly tune the channel or the channel increase or decrease key is sequentially pushed.

In addition to the above channel selection, various information, such as of time, volume, video and audio, may be displayed on the CRT 8 by pushing individual function keys of the remote control unit 1R.

However, such a remote control of the television receiver unit has a problem in that it requires such a complex remote control unit in that it is provided with the plurality of numeral keys numbered 1 to 9 as well as the plurality of function keys, such as for channel up, channel down, volume up and volume down. In addition, it is necessary to repeatedly push the channel increase and decrease keys one by one in channel selection, thereby causing inconvenience and the presence of an error in use of the remote control unit. Furthermore, such a complex remote control unit makes it difficult to be familiar with the functions of the respective keys and causes most of the plurality of keys to be unnecessary to users requiring a simple control, such as the aged and users preferring the rotary type tuning method.

In addition, there has been proposed a remote control unit having a jog shuttle key performing the tape winding function as well as an edit function key. However, key such a remote control unit having a jog shuttle key is not used in controlling a television receiver unit but is used only for operating the tape of a VCR.

SUMMARY OF THE INVENTION

It is, therefore, an object of the present invention to provide an apparatus and method for controlling a television receiver in which the above-mentioned problems can be overcome and which simply performs various functions, including channel selection, by employing rotating a rotary encoder, which is provided to a remote control unit having the has a minimum number of keys.

It is another object of the present invention to provide an apparatus and a method for controlling a television receiver in which at least one rotary encoder is provided with switch means, such as a tact switch or a pushing switch, for performing the recall function as well as the enter function at the same time as channel selection.

To accomplish the above objects, the present invention provides an apparatus for controlling a television receiver comprising: a remote control unit performing selection of various functions of the television receiver and including volume control, the increase or decrease of the channel, and control of the position of an on-screen display on a screen of a cathode ray tube (CRT). The present invention also provides a television receiver unit performing a selected function in response to a remote signal outputted from the remote control unit or to a signal outputted from a keyboard, the remote control unit including a keyboard provided with a plurality of keys controlling various functions of the television receiver unit, a rotary encoder controlling the volume, the increase or decrease of the channel, the increase or decrease of the output level of the on-screen display signal and the position of the on-screen display. The present invention also provides a remote control microprocessor outputting a control signal for performing a selected function in response to both a selection signal outputted from a key of the keyboard and a signal outputted from the rotary encoder, and a remote signal transmitter outputting the control signal of the microprocessor in the form of a radio signal. The television receiver unit comprises: a remote signal receiver for receiving the radio signal outputted from the remote signal transmitter of the remote control unit; a microprocessor for outputting a control signal performing the selected function in accordance with a signal outputted from the rotary encoder or with a signal outputted from the keyboard and; a signal processing unit performing the selected function in accordance with the control signal outputted from the television receiver microprocessor.

The present invention also provides a method for controlling a television receiver comprising the steps of: checking whether the input signal is a rotary encoder signal outputted from the rotary encoder; checking whether the input signal is an increase signal or a decrease signal by comparing the input signal when the input signal is the rotary encoder signal, checking whether the input signal is a key signal when a input signal is not the rotary encoder signal and performing a selected function when the input signal is the key signal; checking whether electric power has been applied, and checking whether the rotary encoder signal has been inputted when the electric power has been applied; operating the inputted rotary encoder signal as a channel increase or decrease signal when the rotary encoder signal has been inputted and no on-screen display signal has been displayed on the screen but operating the inputted rotary encoder signal as a control signal corresponding to the on-screen display signal when the rotary encoder signal has been inputted and an on-screen display signal has been displayed on the screen; checking whether a recall key signal has been inputted when no rotary encoder signal has been inputted, and displaying the on-screen display signal, indicative of the output level of the selected on-screen display signal, on the screen when the recall key signal has been inputted; checking whether a key signal has been inputted and displaying an on-screen display signal of the selected function when the key signal has been inputted.

In accordance with the apparatus and the method for controlling the television receiver of the present invention, when no on-screen display signal has been displayed on the screen, the channel is increased or decreased in accordance with the rotary encoder signal and the volume output level is controlled in accordance with the recall key signal, and the on-screen display signal selected by the key selection signal is displayed on the screen.

At this time, the on-screen display signal on the screen is set in its select position in accordance with the rotary encoder signal inputted after the on-screen display signal is displayed on the screen. At the same time, the on-screen display signal at the selected position is selected when the recall key signal has been inputted.

The on-screen display signal indicative of the output level of the selected on-screen display signal is displayed on the screen. At this time, when the rotary encoder signal has been inputted, the on-screen display signal is controlled to be increased or decreased in its output level.

That is, in accordance with the present invention, the channel selection as well as the volume control of the television receiver unit are performed by a rotary encoder, so that it is easy to operate various functions of the television receiver unit by a simple remote control unit having a minimum number of keys.

BRIEF DESCRIPTION OF THE DRAWINGS

The above and other objects, features and other advantages of the present invention will be more clearly understood from the following detailed description taken in conjunction with the accompanying drawings, in which.

DESCRIPTION OF THE PREFERRED EMBODIMENTS

Figure 1:
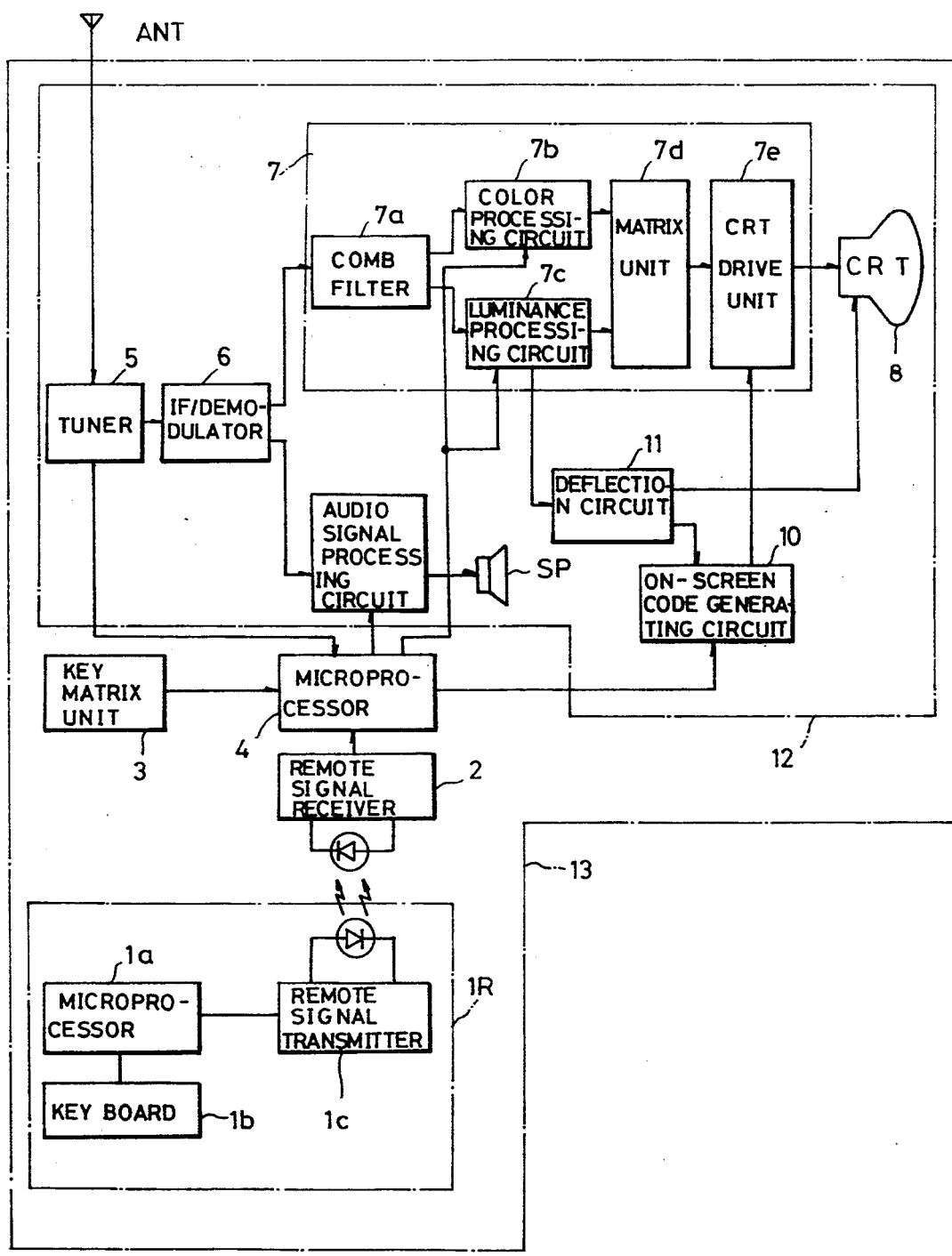
FIG. 1 is a block diagram of a remote controllable television receiver unit and a remote control unit according to the prior art.
Figure 2:
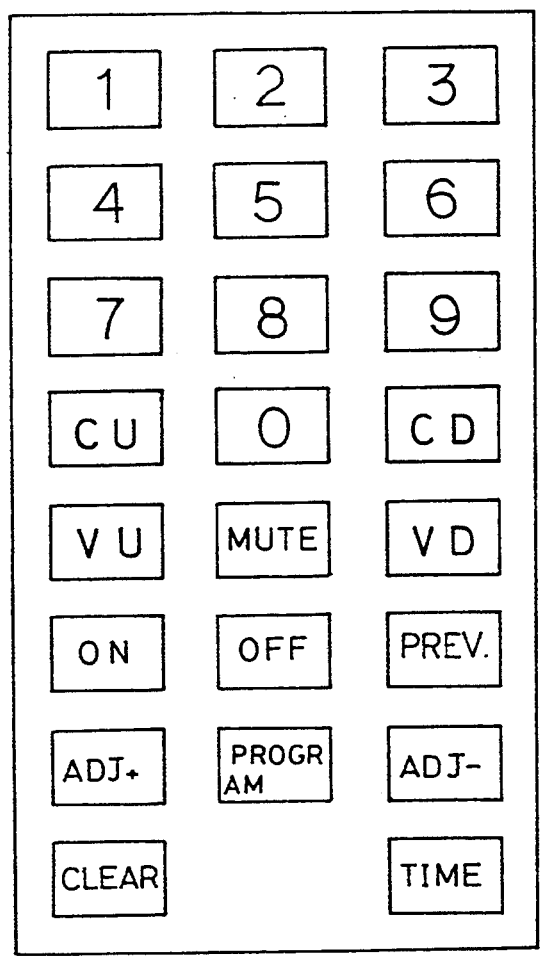
FIG. 2 is a plan view of a keyboard of a conventional remote control unit.
Figure 3:
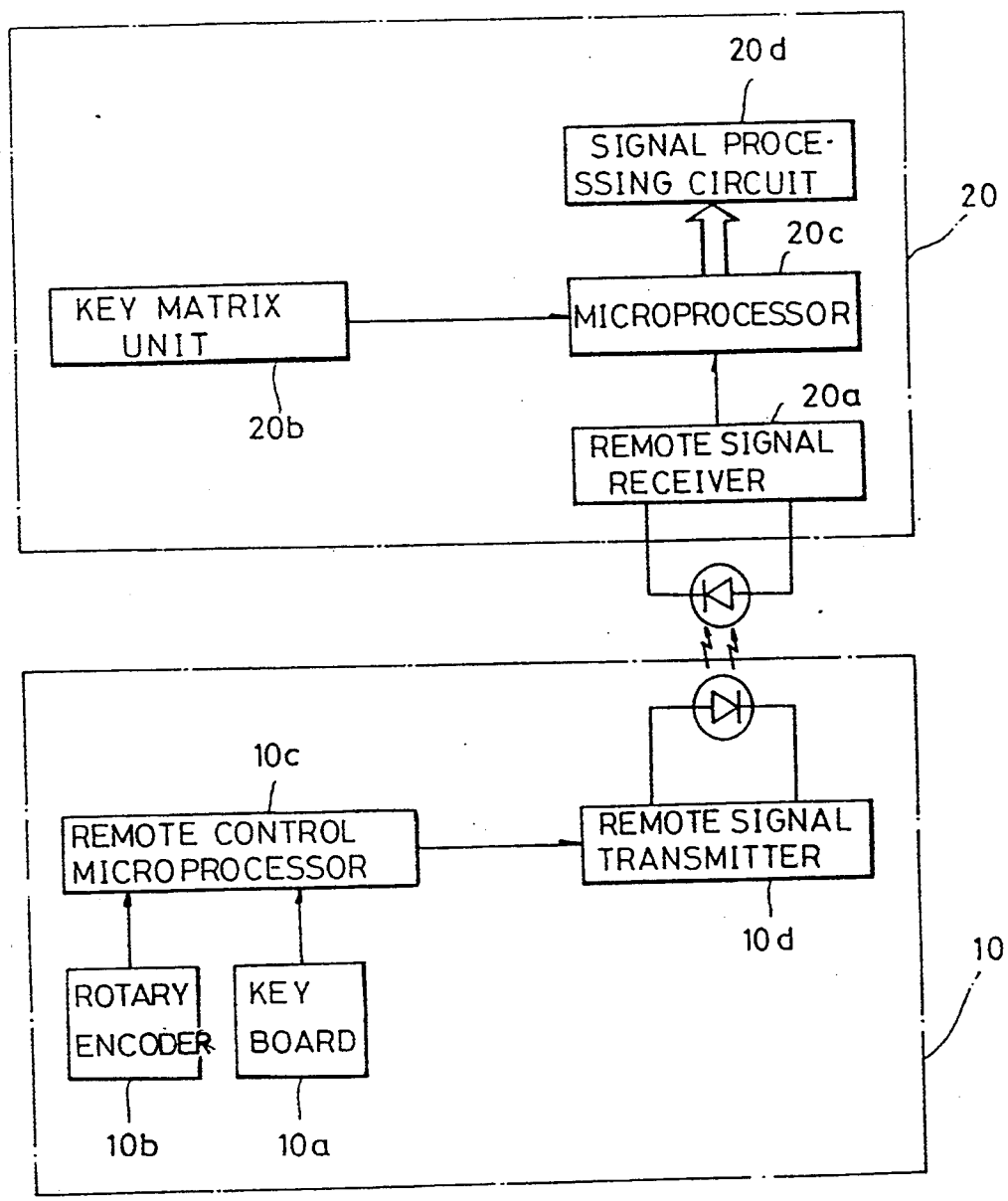
FIG. 3 is a block diagram of a remote controllable television unit and a remote control unit according to an embodiment of the present invention.

With reference to FIG. 3, there is shown in a block diagram a first embodiment of the present invention in which a rotary encoder is provided on a remote control unit and performs various functions including channel selection. The control apparatus of the present invention comprises a remote control unit 10 and a television receiver unit 20. The remote control unit 10 (hereinafter remote controller 10) comprises a keyboard 10a, the rotary encoder 10b, a remote control microprocessor 10c and a remote signal transmitter 10d. The remote controller 10 outputs a radio signal for controlling various functions of the television receiver unit 20, including increase decrease of the volume and of the channel. The remote control let 10 also outputs a radio signal for controlling the on-screen display (OSD) signal output. The television receiver unit 20 comprises a remote signal receiver 20a, a key matrix unit 20b, a microprocessor 20c and a signal processing circuit unit 20d and performs selected functions in response to the radio signals outputted from the remote control unit 10.

Figure 4A:
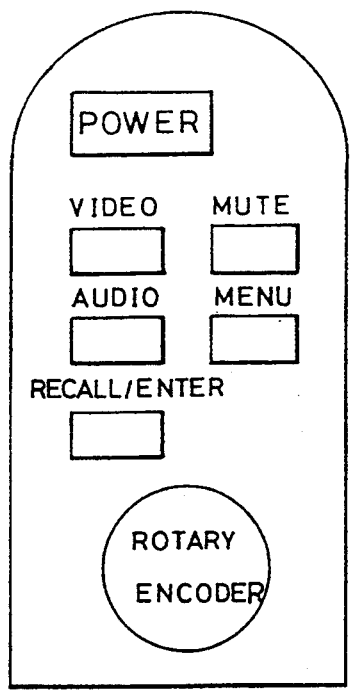
FIGS. 4A and 4B are plan views of remote control units according to different embodiments of the present invention, respectively.
Figure 4B:
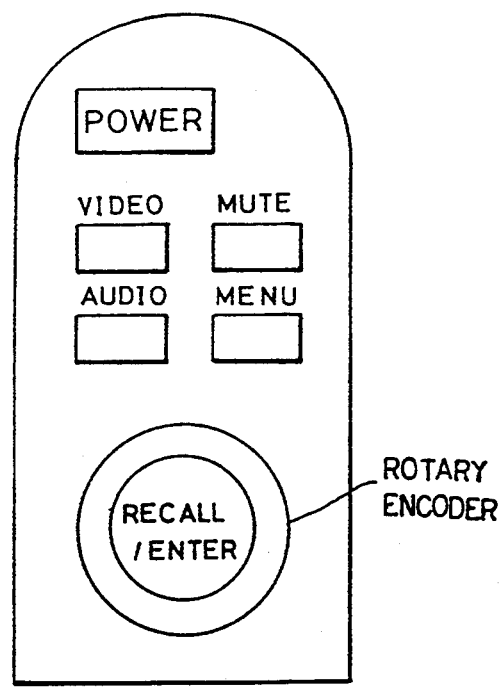

FIGS. 4A and 4B are plan views of remote controllers according to different embodiments of the present invention, respectively. The remote controller of FIG. 4A has a rotary encoder used for controlling channel selection as well as the increase or decrease of the volume. The remote controller of FIG. 4B has two integrated rotary encoders of which the outer rotary encoder controls the channel selection while the inner rotary encoder controls the increase or decrease of the volume as well as the OSD position.

Figure 5:
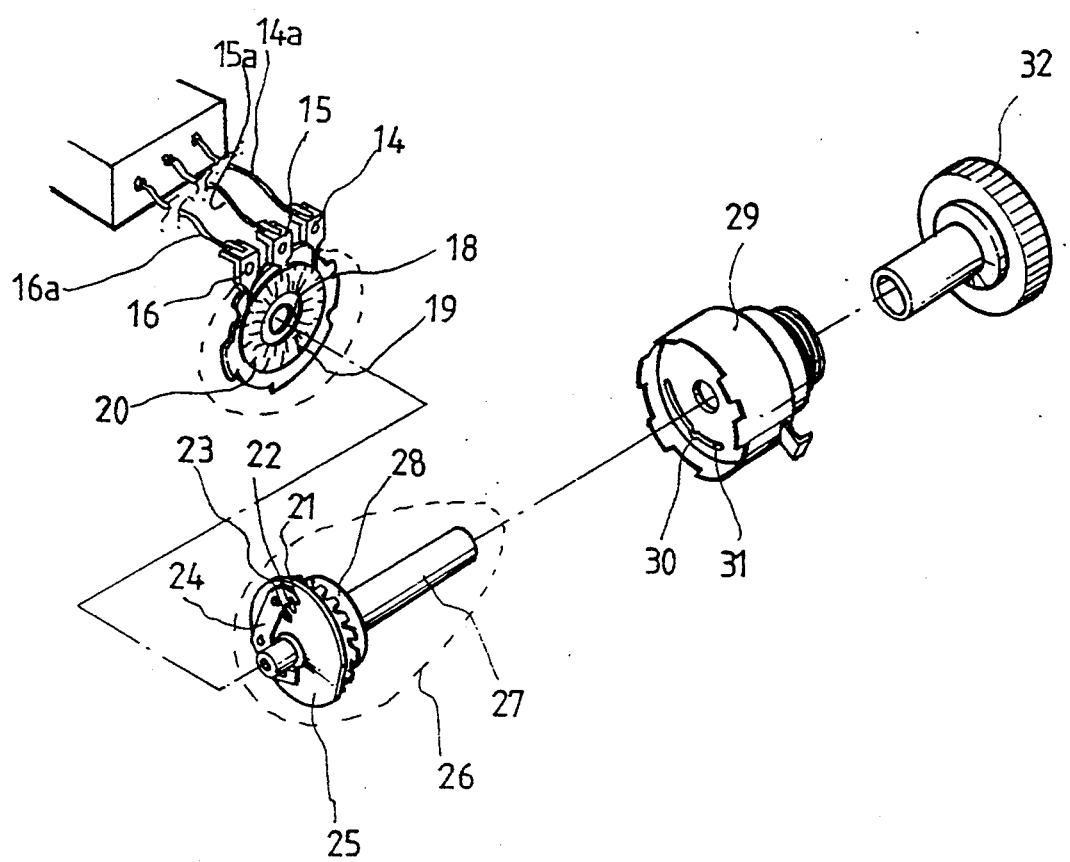
FIG. 5 is an exploded perspective view of a rotary encoder in accordance with an embodiment of the present invention.

Turning to FIG. 5, there is shown in an exploded perspective view an embodiment of a rotary encoder of the present invention. The rotary encoder includes three lead terminals 14 to 16 of which one is connected to a power supply and the others are connected to the remote control microprocessor 10c of FIG. 3. The two lead terminals connected to the microprocessor 10c are also grounded but the grounding of the terminals is not shown in the drawling. The rotary encoder further includes a bracket 29 which is formed with a semicircular copper plate 31 of the slit type having a circular protrusion 30. The bracket 29 engages with a shaft unit 26 having a shaft 27 and a guide tooth part 28 guiding the circular protrusion 30 of the copper plate 31. The shaft unit 26 engages with a rotary knob 32 and is rotated together with the rotary knob 32. The shaft unit 26 further includes on its front disc 25 a slit type iron piece 24 which has a plurality of resilient slit terminals 21 to 23. The terminals 21 to 23 come into contact with a plurality of patterns 18 to 20 of a printed circuit board (PCB) 17 whenever the user rotates the shaft 27 by rotating the rotary knob 32, thereby generating pulse signals.

Figure 6:
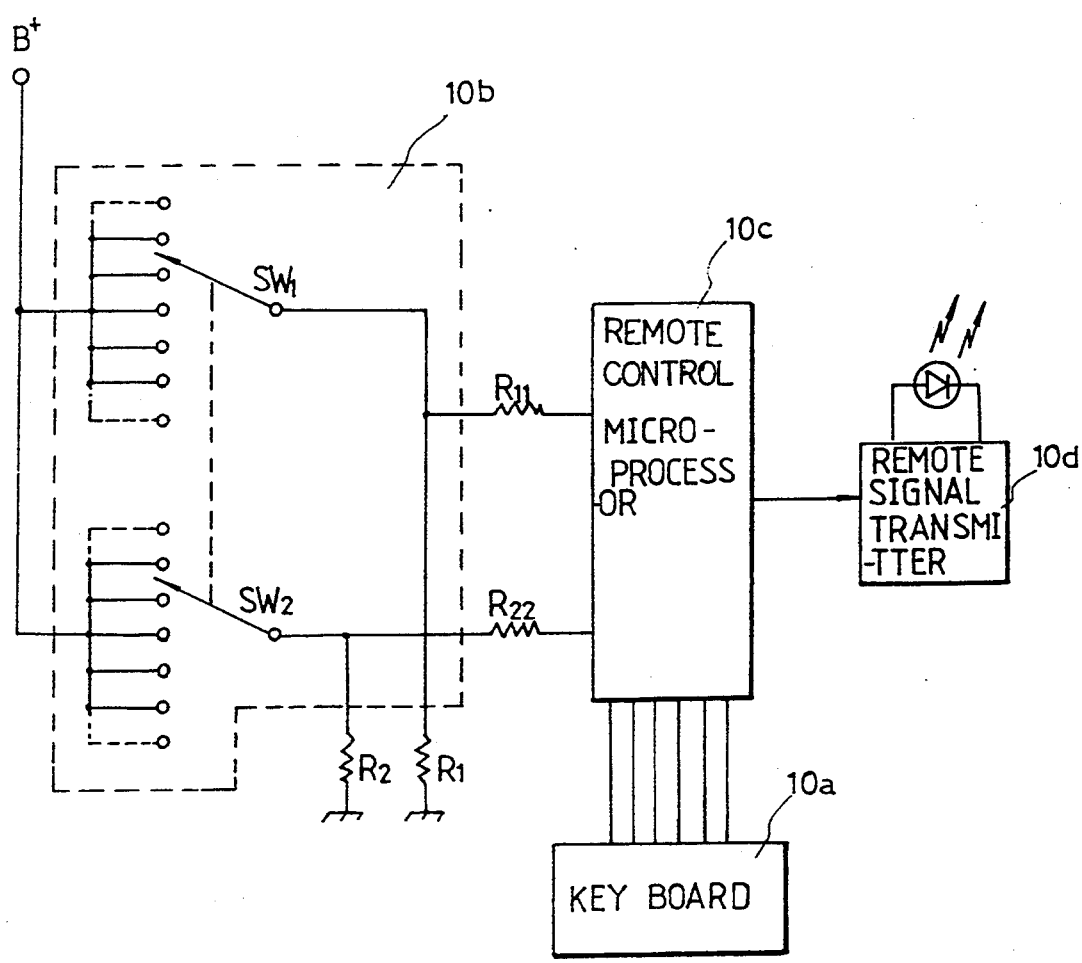
FIG. 6 is a block diagram showing a construction of a remote control unit having the rotary encoder of FIG. 5.

FIG. 6 is a block diagram showing the construction of the remote control unit having the rotary encoder of FIG. 5. In this drawing, the slit terminals 21 to 23 of the iron piece 24 of FIG. 5 are equivalent to the interlocking switches $SW_1$ and $SW_2$ generating two trigger pulses having a phase difference.

Figure 7:
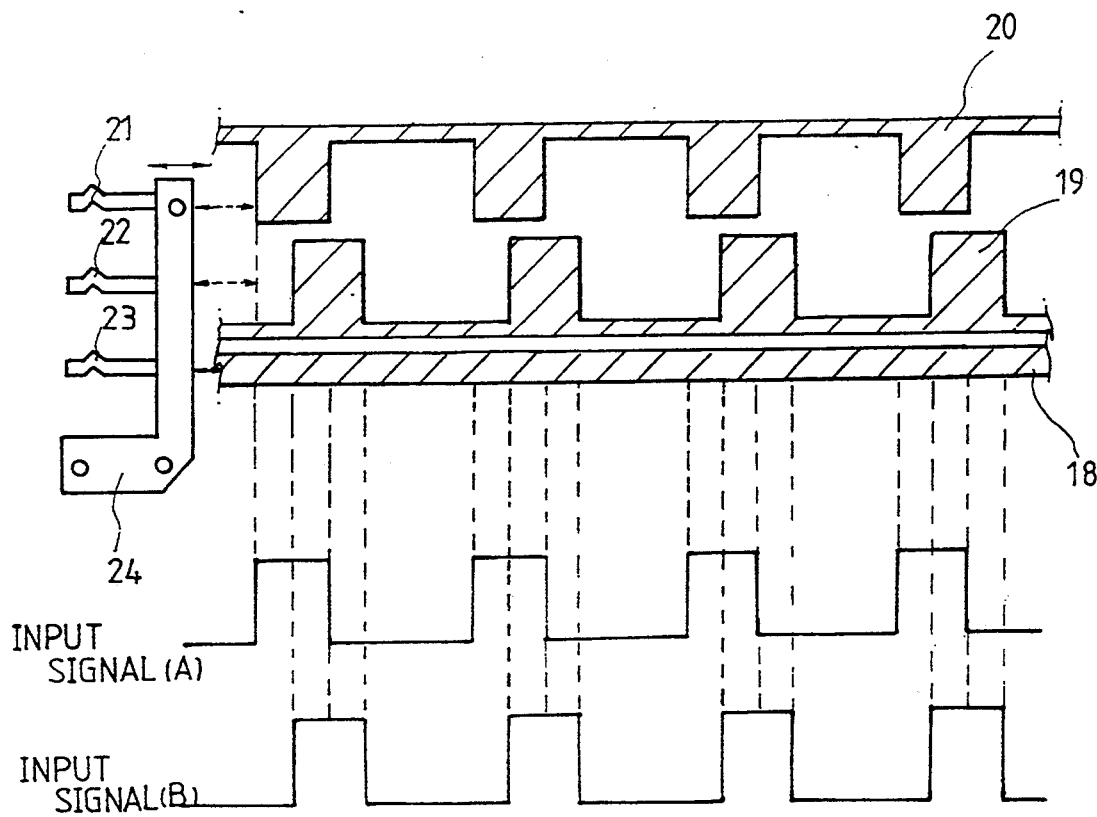
FIG. 7 is a waveform diagram of the trigger signals generated by the rotary encoder of FIG. 5.

Referring to FIG. 7, there is shown a relative position between the slit type iron piece 24 and the copper patterns 18 to 20 of the PCB 17 in accordance with the rotation of the rotary knob 32. This drawing also shows wave forms of the two trigger signals generated by the rotary encoder and applied to the remote control microprocessor 10c of FIG. 3 through a plurality of lead lines 14a, 15b and 16a shown in FIG. 5.

That is, a high signal is outputted when the slit terminal 21 comes into contact with the pattern 20 but a low signal is outputted when the slit terminal 21 is not in contact with pattern 20. In the same manner, a high signal is outputted when the slit terminal 22 comes into contact with the pattern 19 but a low signal is outputted when the terminal 22 is not in contact with pattern 19. In this regard, the two trigger pulses having a phase difference are generated and applied to the remote control microprocessor 10c.

Figure 8A:
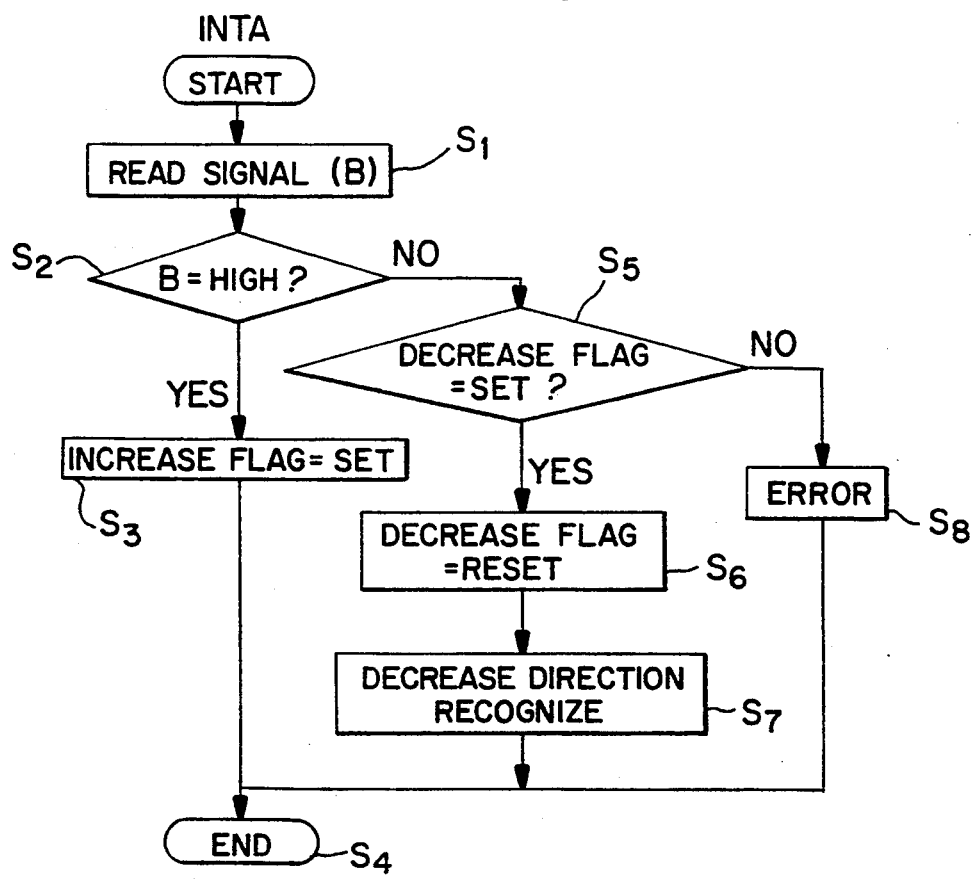
FIGS. 8A and 8B are flow diagrams, each of a process for transmission of a corresponding control signal outputted from the rotary encoder remote control unit in accordance with the present invention.
Figure 8B:
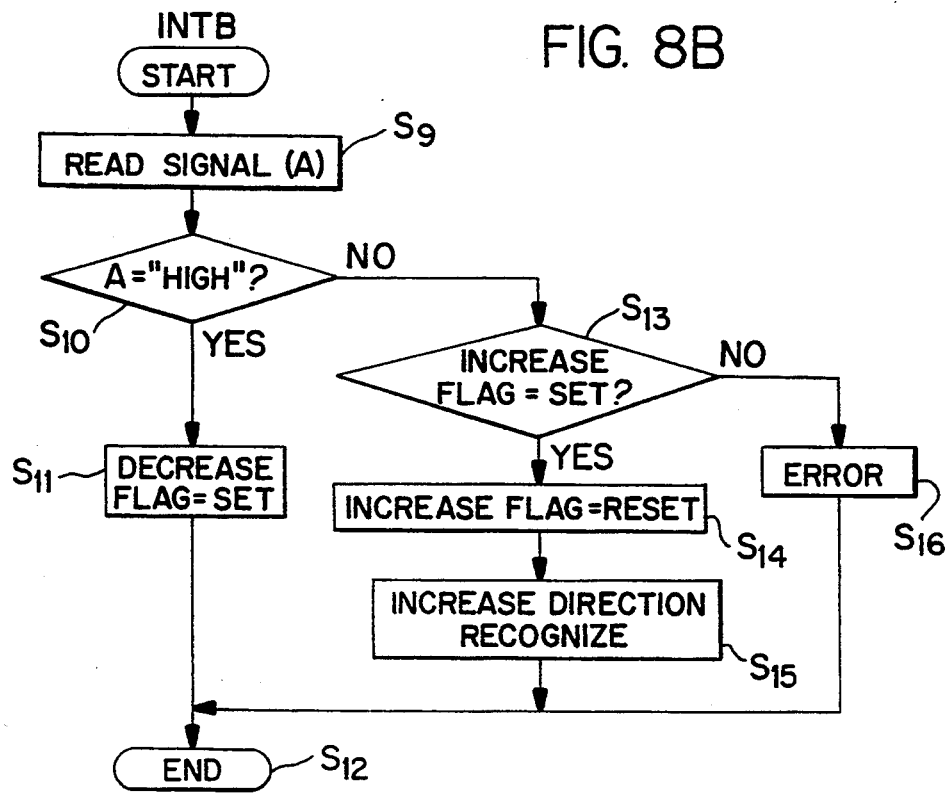

FIGS. 8A and 8B are flow diagrams, each showing a process for transmission of a control signal outputted from the remote control unit 10 having the rotary encoder of this invention. As represented in these flow diagrams, all the two input signals A and B are processed by the interrupt terminals INT A and INT B in order to prevent a faulty operation of the remote control microprocessor 10c due to a noise.

As represented in the flow diagram of FIG. 8A, when the first input signal A has been applied to the first interrupt terminal INT A, at steps $S_1$ and $S_2$ the second input signal B applied to the second interrupt terminal INT B is read and checked top determine whether it is a high signal. When the input signal B is high, the increase flag is set at a step $S_3$ and the operation is ended. However, when the input signal B is low, at a step $S_5$ it is checked whether the decrease flag has been set. When the decrease flag has been set, at steps $S_6$ and $S_7$ the decrease flag is reset and a decrease direction recognizing signal is outputted. In addition, when no decrease flag has been set, at a step $S_8$ the signal is regarded as a pulse caused by a noise and recognized as an error.

Turning to the flow diagram of FIG. 8B, when the second input signal B has been applied to the second interrupt terminal INT B, at steps $S_9$ and $S_{10}$ the first input signal A applied to the first interrupt terminal INT A is read and checked whether it is a high signal. When the input signal A is high, the decrease flag is set at a step $S_{11}$ and the operation is ended. However, when the input signal A is low, at a step $S_{13}$ it is checked whether the increase flag has been set. When the increase flag has been set, at steps $S_{14}$ and $S_{15}$ the increase flag is reset and an increase direction recognizing signal is outputted. In addition, when no increase flag has been set, at a step $S_{16}$ the signal is regarded as a pulse caused by a noise and recognized as an error.

Figure 9:
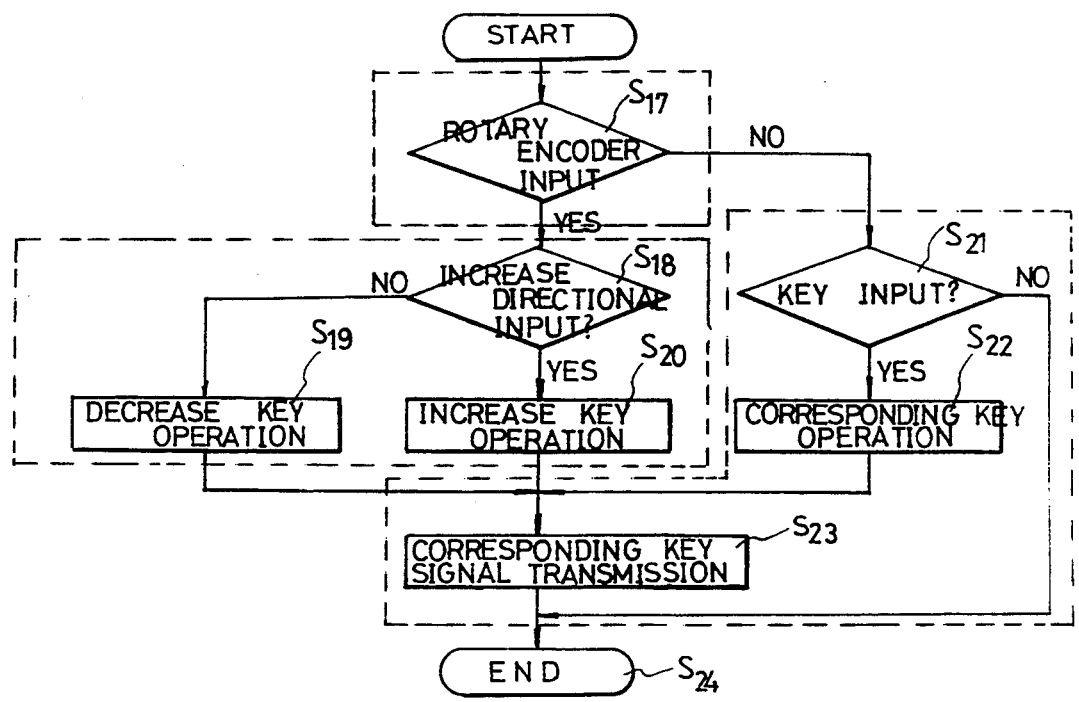
FIG. 9 is a flow diagram for further explanation of the control signal transmission process of FIGS. 8A and 8B.

FIG. 9 is a flow diagram of the operation of the remote control unit having the rotary encoder for further explanation of the control signal transmission processes of FIGS. 8A and 8B. At a step $S_{17}$, it is checked whether a rotary encoder input signal has been applied to an interrupt terminal INT A or INT B. When there is a rotary encoder input signal, at a step $S_{18}$ it is determined whether the input signal is an increase directional signal. When the signal is the increase directional signal, at a step $S_{20}$ the increase key is operated. However, when the signal is not the increase directional signal, at a step $S_{19}$ the decrease key is operated. Thereafter, at a step $S_{23}$ a corresponding key signal is transmitted through a light emit unit of the remote control unit 10 and the operation is ended. On the other hand, when there is no rotary encoder input signal applied to the interrupt terminal, at a step $S_{21}$ it is checked whether a key signal has been inputted. When the key signal has been inputted, a corresponding key is operated and a corresponding key signal is transmitted prior to ending the operation. However, when no key signal has been inputted, the operation is directly ended.

Figure 10A:
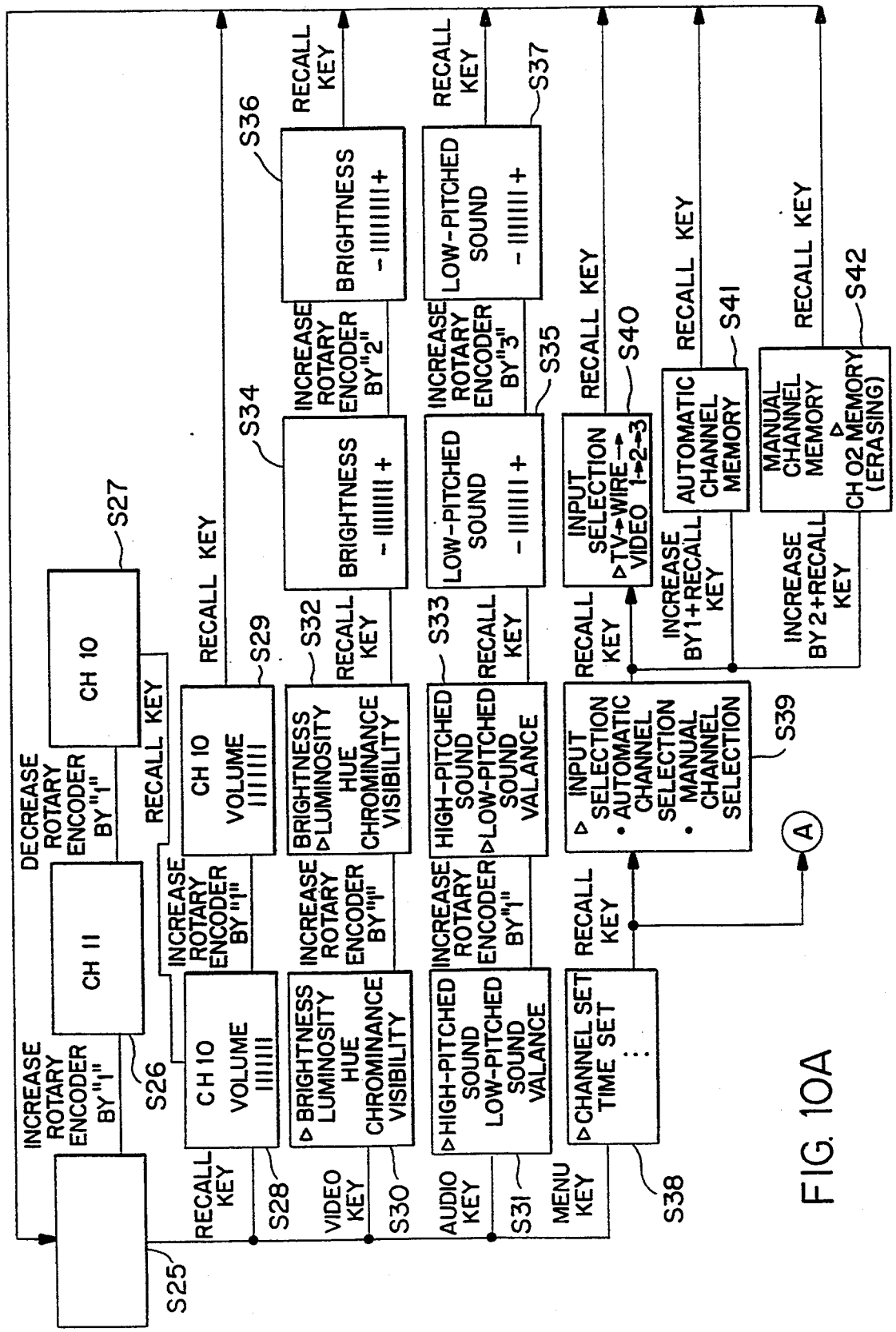
FIGS. 10A and 10B are flow diagrams of an OSD operation in accordance with a key operation of the rotary encoder and other function keys.
Figure 10B:
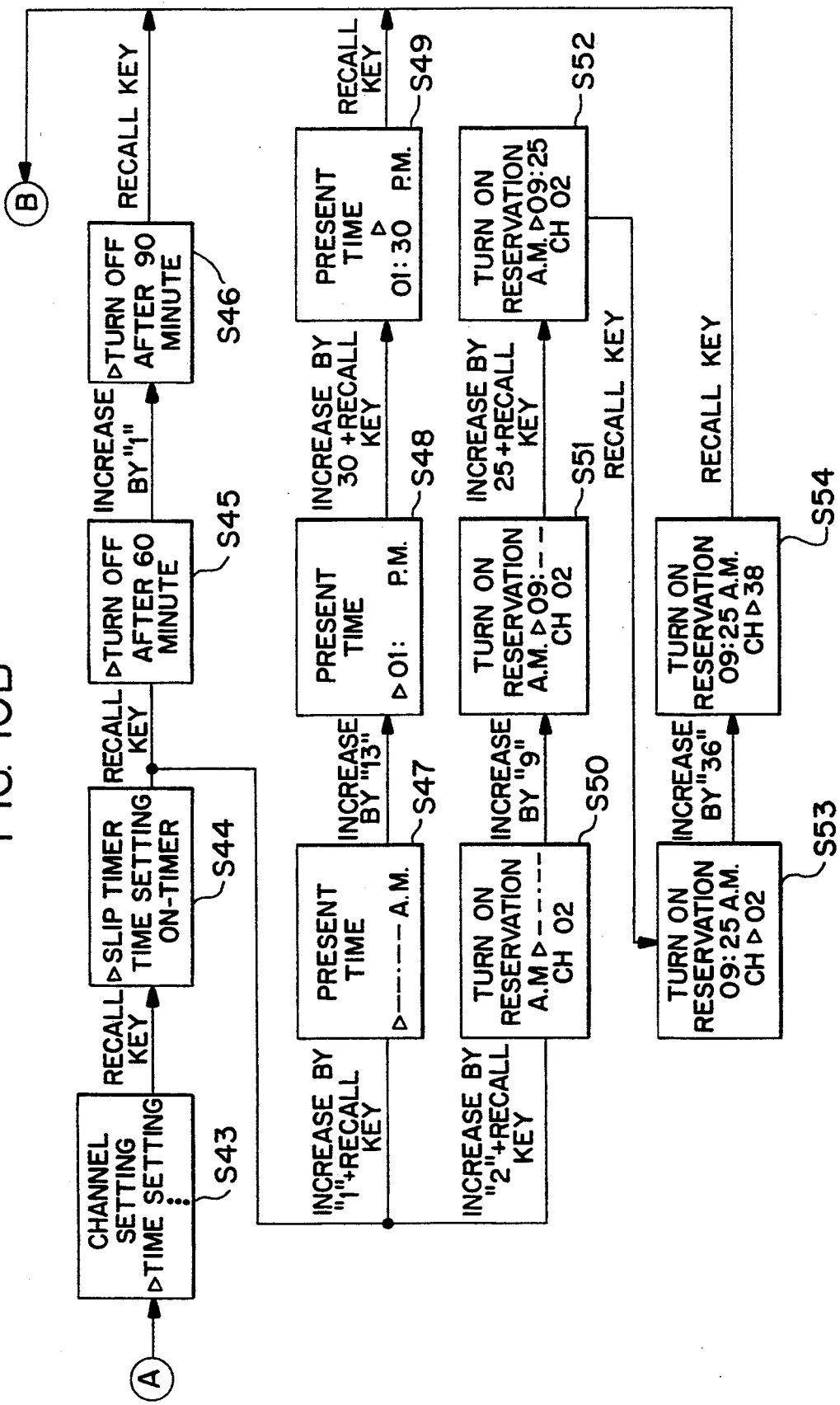

FIGS. 10A and 10B are flow diagrams of an on screen display (hereinafter OSD operation in accordance with both a turning operation of the rotary encoder and key operations of other function keys. When the user turns the rotary encoder under the condition of no OSD, the rotary encoder is increased by 1 pitch at a step $S_{26}$ or decreased by 1 pitch at a step $S_{27}$. When a recall key signal has been inputted under the condition of no OSD signal on the screen, the volume output level is controlled at a step $S_{28}$ and this control state is outputted as an OSD signal at a step $S_{29}$. When a video key signal or an audio key signal has been inputted under the condition of no OSD signal on the screen, a corresponding OSD signal is displayed on the screen at a step $S_{30}$ or $S_{31}$. At this state, when a rotary encoder signal has been inputted, the OSD signal on the screen is changed in its select position at a step $S_{32}$ or $S_{33}$. At this time, when a recall key signal has been inputted, at a step $S_{34}$ or $S_{35}$ a selected OSD signal, such as the character "Brightness" or "Low-Pitched Sound", is displayed on the screen together with a present output level code. At this state, when a rotary encoder signal has been inputted, at a step $S_{36}$ or $S_{37}$ a selected output level code is displayed on the screen together with the character. When a focal 1 key signal has been inputted, the OSD signal is erased from the screen.

On the other hand, when a menu key signal has been inputted, a selectable menu is displayed in the form of an OSD signal on the screen. Here, when a channel set menu has been selected at a step $S_{38}$, the channel is automatically or manually selected in accordance with rotary encoder signals and recall key signal s at steps $S_{39}$ to $S_{42}$. However, when a time set menu has been selected at a step $S_{43}$, at steps $S_{39}$ to $S_{54}$ a reserved automatic turn off time, a present time and a reserved automatic turn on time are set in accordance with rotary encoder signals and recall key signals.

Figure 11A:
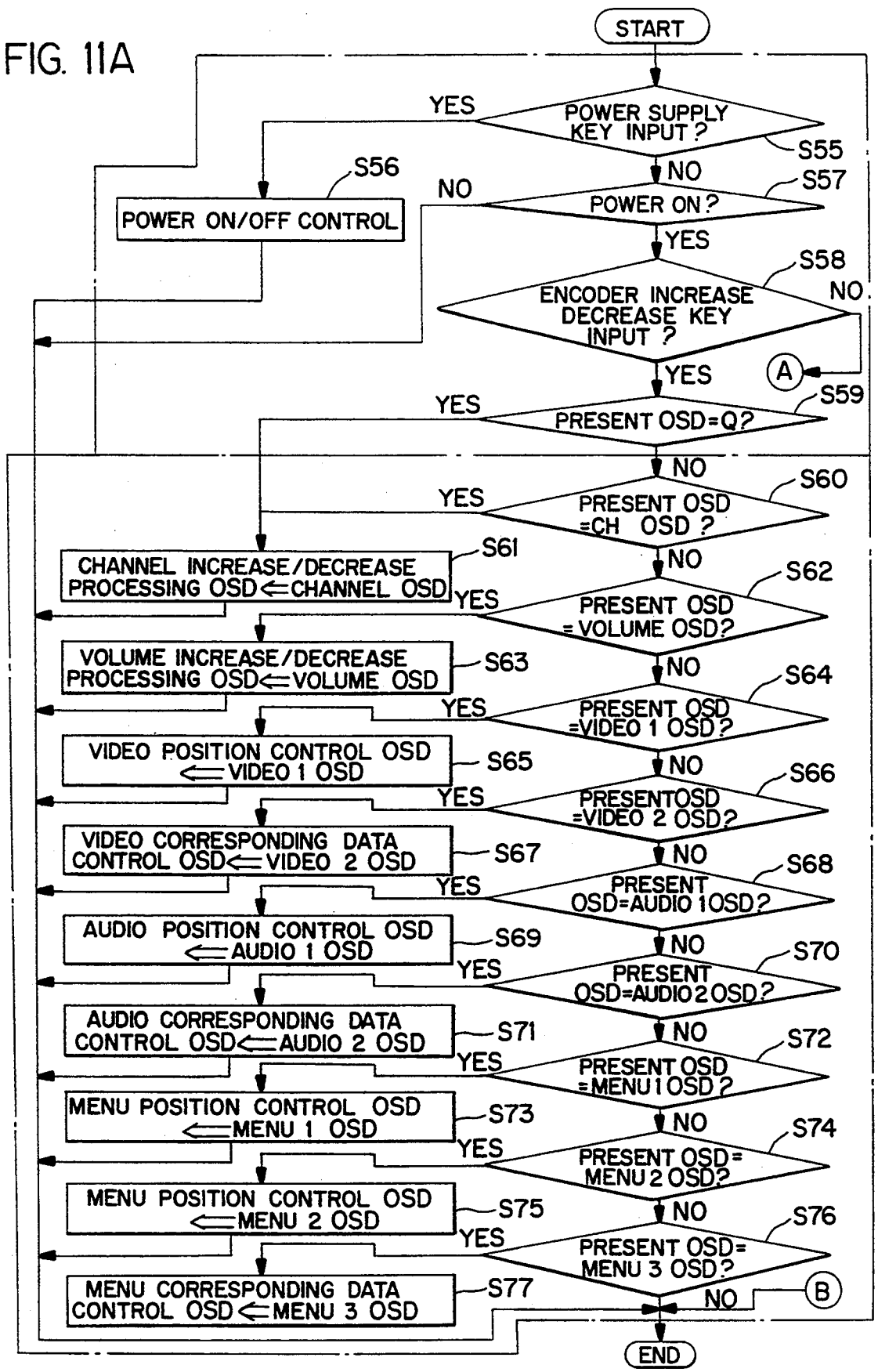
FIGS. 11A and 11B are flow diagrams of an operation of a television receiver unit having the rotary encoder of the present invention in accordance with a signal outputted from the remote control unit.
Figure 11B:
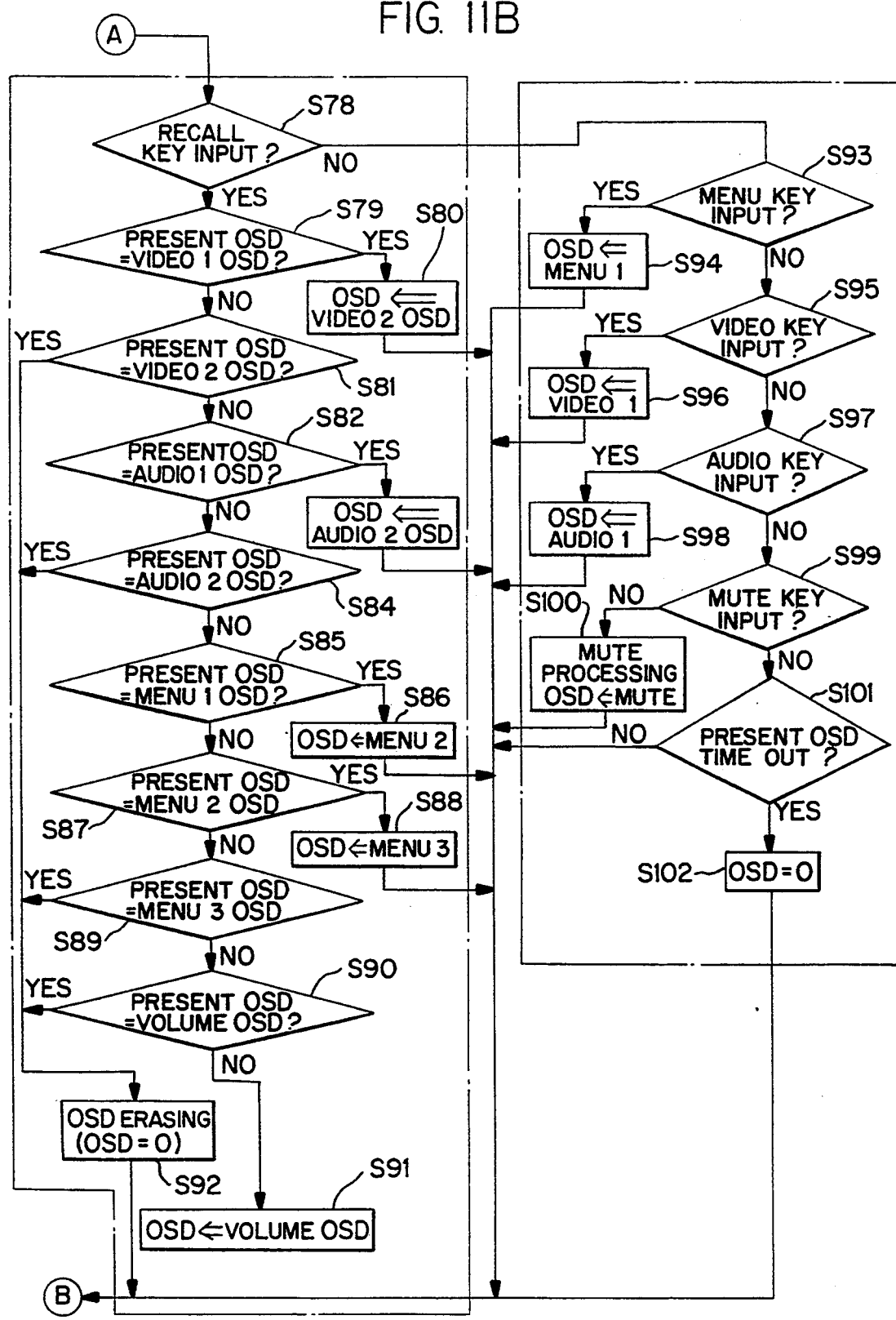

Turning to FIGS. 11A and 11B, there are shown continued flow diagrams of an operation of the microprocessor 4 of the television receiver unit 20 in accordance with a signal outputted from the remote control unit 10 having the rotary encoder lob of the present invention. At steps $S_{55}$ to $S_{57}$ is checked whether the power has been applied. When the power has been applied, at a step $S_{58}$ it is checked whether a rotary encoder increase or decrease key signal has been inputted. When the rotary encoder key signal has been inputted, at a step $S_{59}$ it is checked whether there has been an OSD signal on the screen. When there is no OSD signal on the screen, at a step $S_{61}$ the inputted rotary encoder key signal is operated as a channel increase or decrease signal. However, when an OSD signal has been on the screen, at steps $S_{80}$ to $S_{77}$ the inputted rotary encoder signal is operated as a control signal corresponding to the OSD signal. When at the step $S_{58}$ it is determined that no rotary encoder key signal has been inputted, at a step $S_{78}$ it is checked whether a recall key signal has been inputted. When it is determined that the recall key signal has been inputted, at steps $S_{79}$ to $S_{92}$ an OSD signal indicative of the output level of the selected OSD signal is displayed on the screen. However, when no recall key signal has been inputted, at steps $S_{93}$ to $S_{102}$ it is checked whether a function key signal, such as a menu key signal, a video key signal, an audio key signal or a mute key signal, has been inputted. When a function key signal has been inputted, an OSD signal indicative of the selected function is displayed on the screen.

Hereinafter, the operational effect of the rotary encoder according to the primary embodiment of the present invention will be described in conjunction with FIG. 5.

Upon rotation of the rotary knob 32 of the rotary encoder for controlling the television receiver unit, the shaft 27 of the shaft un it 26 is rotated together with the knob 32, thereby causing the circular protrusion 30 of the bracket 26 to move with respect to the guide tooth part 28 of the shaft unit 26.

At the same time of rotation of the shaft unit 26, the resilient slit terminals 21 to 23 of the slit type iron piece 24 of the shaft unit 26 come into contact with the copper patterns 18 to 20 of the PCB 17, respectively.

Otherwise stated, the rotation of the rotary knob 32 for channel selection causes the slit type iron piece 24 of the shaft unit 26 to move on the printed circuit board 17 (hereinafter PCB 17) in such a manner that the slit terminal 21 moves on the pattern 18, the slit terminal 22 moves on the pattern 19 and the slit terminal 23 moves on the pattern 20.

Therefore, the two trigger pulses, or the input signals A and B of FIG. 7, are applied to the remote control microprocessor 10c. At this time, since there may be the presence of faulty operation caused such as by a noise when a single trigger pulse is applied to the microprocessor 10c, the present invention applies two trigger pulses having a defined the phase difference to the microprocessor 10c, thereby providing a stable operation.

The process for transmission of the corresponding control signal performed by turning the rotary encoder 10b will be described hereinbelow in conjunction with the flow diagrams of FIGS. 8A and 8B.

In the remote control microprocessor 10c, the two input signals A and B are processed by the interrupt terminals INT A and INT B in order to prevent faulty operation of the microprocessor 10c caused by noise.

As represented in the flow diagram of FIG. 8A, when the input signal A has been applied to the interrupt terminal A, ("INTA" in FIG. 8A) at step $S_1$ the input signal B applied to the interrupt terminal B ("INT B" in FIG. 8B) is read and at step $S_2$ it is checked whether the signal B is a high signal or a low signal.

When input B is high signal, at the step $S_3$ the increase flag is set prior to ending the operation.

However, when input B is the low signal, at step $S_5$ it is checked whether the decrease flag has been set. When it is determined that the decrease flag has been set, the decrease flag is reset at the step $S_6$, the input signal is recognized as a decrease directional signal at step S—, and the operation is ended. At step $S_5$ it is determined that no decrease flag has been set, at the step $S_8$ the low level input signal is regarded as an error pulse caused by a noise.

Turning to the flow diagram of FIG. 8B, when the input signal B has been applied to the interrupt terminal B, at the step $S_9$ the input signal A applied to the interrupt terminal A is read and at step $S_{10}$, it is checked whether the signal A is a high signal or a low signal. When the input signal A is high, at the step $S_{11}$, the decrease flag is set prior to ending the operation.

However, when at step $S_{10}$ it is determined that the input signal A is low, at step $S_{13}$ it is checked whether the increase flag has been set. When it is determined that the increase flag has been set, the increase flag is reset at the step $S_{14}$, and the input signal is recognized as an increase directional signal at step $S_{15}$, and the operation is ended. At step $S_{13}$ it is determined that no increase flag has been set, and at step $S_{16}$ the low level input signal is regarded as an error pulse caused by noise.

In order to further explain the above interrupt signal processing, the operation of the remote control unit having the rotary encoder will be described in conjunction with FIG. 9. At the step $S_{17}$, it is checked whether a rotary encoder input signal has been applied to interrupt terminals INTA or INTB. When the rotary encoder input signal is present, at the step $S_{18}$, it is determined whether the signal is the increase directional signal. When the input signal is the increase directional signal, at step $S_{20}$ the increase key is operated. However, when the input signal is not the increase directional signal, at the step $S_{19}$ the decrease key is operated. Thereafter, at step $S_{23}$ the corresponding key signal is transmitted to the television receiver unit 20 through the remote signal transmitter of the remote control unit and the operation is ended.

At the step $S_{17}$ it is determined that there is no rotary encoder input signal applied to the interrupt terminal and at the step $S_{21}$ it is checked whether a function key signal has been inputted. When the function key signal has been inputted, at the steps $S_{22}$, respectively and $S_{23}$ a corresponding key is operated and a corresponding key signal is transmitted to the television receiver unit 20 prior to ending the operation. However, when it is determined that no key signal has been inputted, the operation is directly ended.

The signal outputted from the remote control unit 10 is received by the television receiver unit 20. Upon reception of the signal, the television receiver unit 20 performs the selected function in accordance with the processing flow diagram of FIGS. 11A and 11B. For further explanation of the present invention, the change of OSD is described in accordance with the turning operation of the rotary encoder and the key operations of other function keys, in conjunction with FIGS. 10A and 10B.

During watching a program of channel 10 under the condition of no OSD at the step $S_{25}$, clockwise turning of the rotary encoder by 1 pitch causes the step $S_{26}$ to be performed for increasing the channel by 1 step, so that the channel 10 is changed to a channel 11 and the character "CH 11" is displayed on the screen.

At this state, when the step $S_{27}$ is performed as a result of counterclockwise turning of the rotary encoder by 1 pitch, the channel is decreased by 1 step, so that the channel 11 is changed to the channel 10 and the character "CH 10" is displayed on the screen. When the recall/enter key is pushed during watching the program of channel 10, the character "CH 10" indicative of the channel 10 and the volume level code are displayed on the screen together with the character "Volume", At this state, when the rotary encoder is turned clockwise by 1 pitch in order to perform the step $S_{29}$ wherein the volume level is increased by 1 step. Thereafter, pushing of the recall/enter key causes the character and the code displayed on the screen to be erased. On the other hand, when the video key is pushed, the step $S_{30}$ is performed for displaying data, stored in the memory of the microprocessor 20c of the television receiver unit 20, on the screen. At this state, when the rotary encoder 10b is turned clockwise by 1 pitch, the step $S_{32}$ is performed for moving the select position downwardly by 1 step and, at this state, pushing of the recall/enter key causes the character "Brightness" to be displayed on the screen together with the brightness code indicative of the present brightness level.

In this case, clockwise turning of the rotary encoder 10b by 2 pitches causes the step $S_{36}$ to be performed for increasing the output level of the brightness by 2 steps and for displaying the brightness code indicative of the increased brightness level on the screen.

When the recall/enter key is pushed at this state, the OSD is erased from the screen. In the same manner, when the audio key is pushed, the step $S_{31}$ is performed for displaying data, stored in the memory of microprocessor 20c of the television receiver unit 20, on the screen. At this state, when the rotary encoder is turned clockwise by 1 pitch, the step $S_{33}$ is performed for moving the select position downwardly by 1 step and, at this state, pushing of the recall/enter key causes the character "Low-Pitched Sound" to be displayed on the screen together with the volume code indicative of the present volume level.

In this case, clockwise turning of the rotary encoder 10b by 3 pitches causes the step $S_{37}$ to be performed for increasing the output level of the volume by 3 steps and for displaying the volume code indicative of the increased volume on the screen.

When the recall/enter key is pushed at this state, the OSD is erased from the screen.

On the other hand, in the case of selection of menu, pushing of the menu key causes displaying of the OSD on the screen. When the recall/enter key is pushed at this state, the step $S_{39}$ is performed for displaying the characters "Input Selection", "Automatic Channel Selection" and "Manual Channel Selection" on the screen. At this state, when the recall/enter key is pushed again, the step $S_{40}$ is performed for displaying the characters of the input selection menu, that is, the characters "TV→Wire→Video", on the screen. Pushing of the recall/enter key at this state enables selection of a desired menu.

When the recall/enter key is pushed after clockwise turning of the rotary encoder by 1 pitch, the step $S_{41}$ is performed for displaying the character "Automatic Channel Memory" on the screen. On the other hand, when the recall/enter key is pushed after clockwise turning of the rotary encoder by 2 pitches, the step $S_{42}$ is performed for displaying the character "Manual Channel Memory" on the screen.

At this state, pushing of the recall/enter key makes the OSD be erased.

In addition, the step $S_{43}$ of FIG. 10B is performed as a result of clockwise turning of the rotary encoder by 1 pitch at the step $S_{38}$ and results in the selection of time set. At this state, pushing of the recall/enter key causes the step $S_{44}$ to be performed for displaying the menu characters "Slip Timer", "Time Set" and "ON-Timer" on the screen.

When the recall/enter key is pushed at the state of selection of "Slip Timer", the step 45 is performed for displaying the character "Turn Off After 60 min". At this state, when the rotary encoder $10b$ is turned clockwise by 1 pitch, at the step $S_{46}$ the character "Turn Off After 90 min" is displayed on the screen. As described above, the slip timer is controlled by the clockwise turning of the rotary encoder.

In addition, when the recall/enter key is pushed after clockwise turning of the rotary encoder by 1 pitch under the condition of selection of "slip Timer", at the step $S_{47}$ the character "Present Time" is displayed on the screen. At this state, the rotary encoder $10b$ is turned clockwise until the character indicative of a desired time is displayed on the screen, so that at the steps $S_{48}$ and $S_{49}$ the desired time is set and its character is displayed on the screen.

On the other hand, when the recall/enter key is pushed after clockwise turning of the rotary encoder by 2 pitches under condition of selection of "Slip Timer", at the step $S_{50}$ the character "Turn On Reservation" is displayed on the screen. At this state, the rotary encoder is turned clockwise until the character of a desired time is displayed on the screen, so that at steps $S_{51}$ to $S_{54}$ the on-timer function is performed.

Turning now to FIGS. 11A and 11B, there is shown the process for receiving the signal outputted from the remote control unit.

As represented in the flow diagrams of these figures, at the step $S_{55}$ it is checked whether a power key signal has been inputted. When the power key signal has been inputted, at the step $S_{56}$ a conventional power on/off control function is performed. However, when no power key signal has been inputted, at the step $S_{57}$ it is checked whether the power has been turned on. When the power has been turned on, at an step $S_{58}$ it is checked whether the encoder increase or decrease key signal has been applied. When an encoder increase or decrease key signal has been applied, at the step $S_{59}$ it is checked whether there has been no OSD. When there has been no OSD, at the step $S_{5l}$ the channel is increased or decreased under the control of the channel increase or decrease key. When there has been OSD, at the step $S_{60}$ it is checked whether the present OSD is the channel OSD. When the step $S_{61}$. However, when the present OSD is not the channel OSD is the channel OSD, the operation proceeds to the OSD, at the step $S_{62}$ it is checked whether the present OSD is the volume OSD. When the present OSD is the volume OSD, at the step $S_{63}$ the volume is controlled by the volume increase or decrease key. However, when at the step $S_{64}$ it is determined that the present OSD is the first video OSD for selection of the video position, such as brightness, luminosity, hue and etc., at the step $S_{65}$ the video position is controlled by the video position select key. When at the step $S_{66}$ it is determined that the present OSD is the second video OSD indicative of the output level, at the step $S_{67}$ the output level of a selected video is increased or decreased under the control of the corresponding video output level increase or decrease key.

However, when at the step $S_{68}$ it is determined that the present OSD is the first audio OSD for selection of the audio position, such as high-pitched sound or low-pitched sound, at the step $S_{69}$ the audio position is controlled by the audio position select key. When at the step $S_{70}$ it is determined that the present OSD is the second audio OSD indicative of the output level, at the step $S_{71}$ the output level of a selected audio is increased or decreased under the control of the corresponding audio output level increase or decrease key.

When at the step $S_{72}$ it is determined that the present OSD is the first menu OSD for selection of the menu position, such as channel set and time set at the step $S_{73}$ the menu position is controlled by the menu position select key. When the channel set has been selected and at the step $S_{74}$ it is determined that the present OSD is the second menu OSD for automatic channel selection or manual channel selection, at the step $S_{75}$ the channel selection style is selected by the menu position select key.

On the other hand, if at the step $S_{58}$ it is determined that no encoder increase or decrease key signal has been applied, at the step $S_{78}$ (FIG 11B) it is checked whether a recall key signal has been applied.

Thereafter, when at one of the steps $S_{79}$, $S_{82}$ and $S_{85}$, respectively it is determined that the present OSD is either the-first video OSD, the first audio OSD or the first menu OSD, at a step $S_{80}$, $S_{83}$ or $S_{86}$ the present OSD in the form of the second video OSD, the second audio OSD or the second menu OSD is displayed on the screen. However, when at one of the steps $S_{81}$, $S_{84}$, $S_{89}$ and $S_{90}$, respectively it is determined that the present OSD is either the second video OSD, the second audio OSD, the third menu OSD or the volume OSD. At the step $S_{92}$ the present OSD is erased.

On the other hand, when at the step $S_{78}$ it is determined that no recall key signal has been applied, the steps $S_{93}$, $S_{95}$, $S_{97}$ and $S_{99}$, respectively it is checked whether either a menu key signal, a video key signal, an audio key signal or a mute key signal has been applied. When it is determined that a menu key signal has been applied, at the step $S_{94}$ the first menu OSD is displayed on the screen. When it is determined that the video key signal has been applied, at the step $S_{98}$ the first video OSD is displayed on the screen. When it is determined that the audio key signal has been applied, at the step $S_{99}$ the first audio OSD is displayed on the screen. When it is determined that the mute key signal has been applied, at the step $S_{100}$ the mute processing is carried out together with displaying the mute OSD on the screen. When it is determined that there is no key signal input, at the step $S_{101}$ it is checked whether the OSD time has expired. When the OSD time has expired, at the step $S_{102}$ the OSD is erased prior to ending of the operation. However, when the OSD time has not expired, the operation is directly ended.

Figure 12:
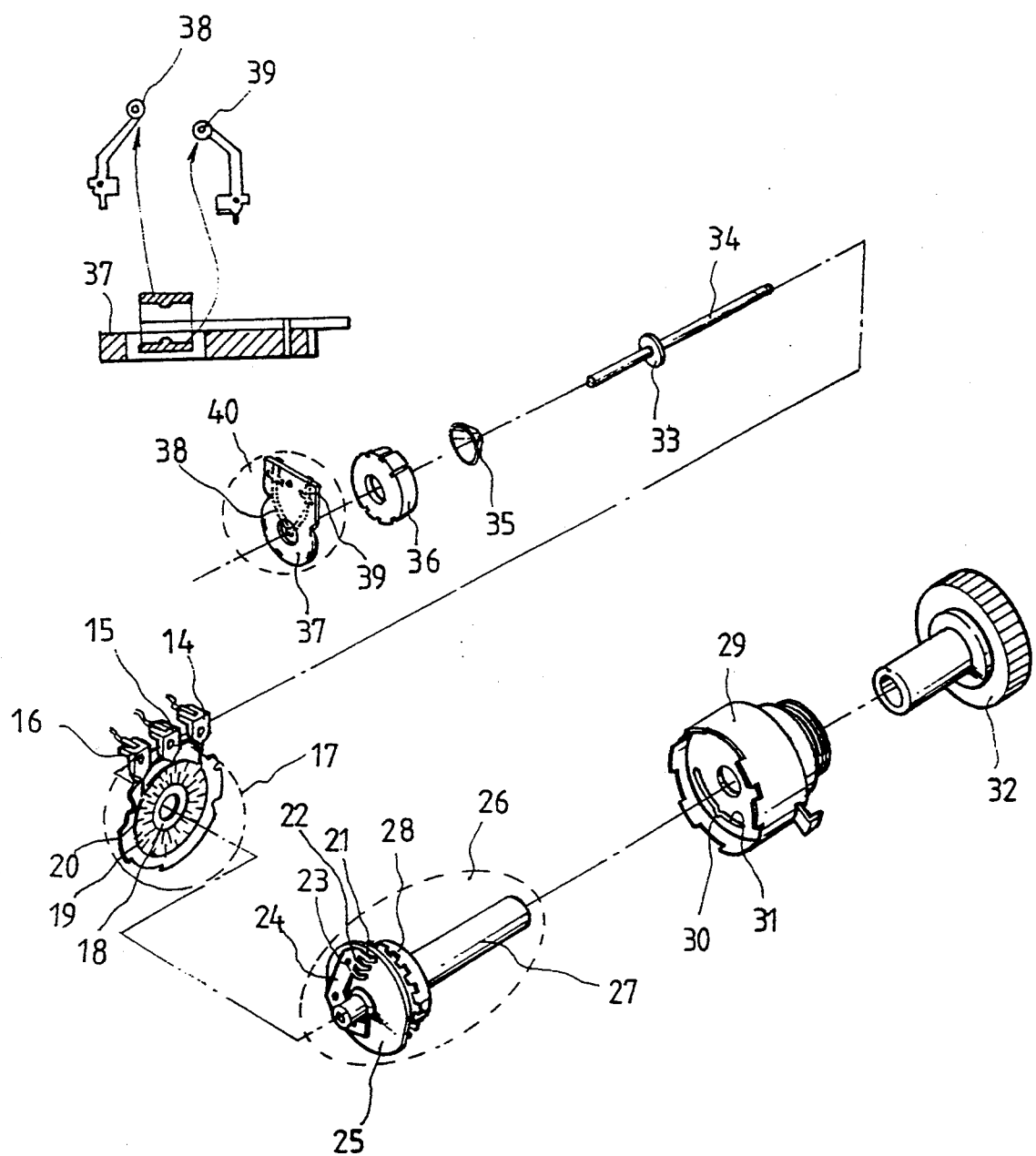
FIG. 12 is an exploded perspective view of a rotary encoder in accordance with another embodiment of the present invention.

Turning to FIG. 12, there is shown in an exploded perspective view a rotary encoder in accordance with a second embodiment of the present invention. This second embodiment is constructed such that, upon pushing the rotary knob 32, a tact switch shaft 34 of the shaft 27 moves to cause a protrusion 33 fixed to the switch shaft 34 to compress a diaphragm spring 35 in a spring holder 36. At the same time of compressing the diaphragm spring 35, the switch shaft 24 makes two resilient tact terminals 38 and 39 come into contact with each other. That is, in this second embodiment, the rotary encoder is provided with switch means such that it is integrated with the recall/enter key section.

Figure 13:
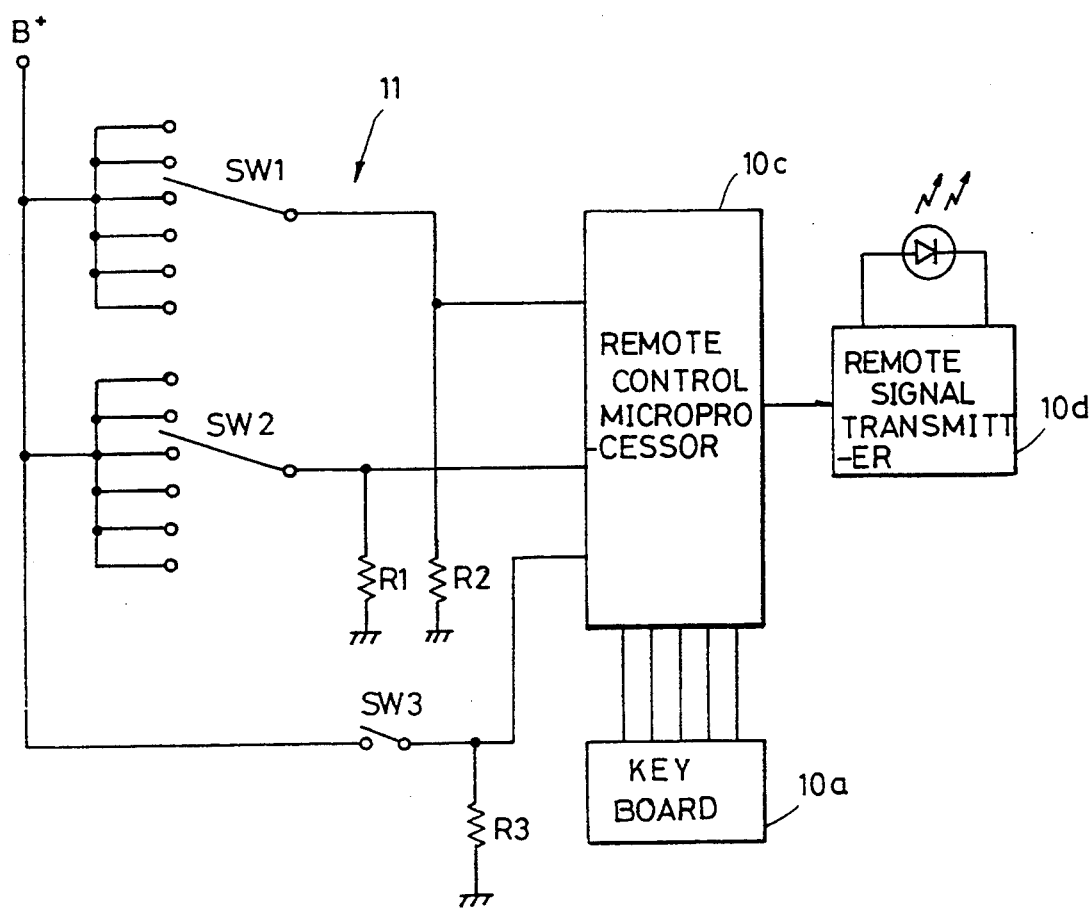
FIG. 13 is a block diagram showing a construction of a remote control unit having the rotary encoder of FIG. 12.

FIG. 13 is a block diagram showing the construction of a remote control unit combined with the rotary encoder of FIG. 12. As shown in this drawing, the remote control microprocessor 10c is connected to a switch SW$_3$ which controls the supply of power thereto in accordance with ON/OFF of the resilient tact terminals 38 and 39.

In operation of the rotary encoder according to the second embodiment, upon pushing the rotary knob 32, the tact switch shaft 34 moves to cause the protrusion 33 of the switch shaft 34 to compress the diaphragm spring 35 in the spring holder 36. At the same time, the two resilient tact terminals 38 and 39 come into contact with each other due to the movement of the shaft 34.

At this state, when the pushing force of the rotary knob 32 is removed, the switch shaft 34 is spaced apart from the spring holder 36 due to the restoring force of the diaphragm spring 35, thereby separating the tact terminals 38 and 39 from each other. Hence, the microprocessor 10c recognizes that there is one pushing signal.

In the second embodiment shown in FIG. 12, those elements which are common to both the primary first embodiment and the second embodiment carry the same reference numerals as described above and no further explanation thereof is deemed necessary.

For further explanation, the operation of the remote control unit having a rotary knob according to the second embodiment will be described in conjunction with FIG. 13.

The short state of the tact terminals 38 and 39 means that the rotary knob 32 is pushed. At this short state, the remote control microprocessor 10c is applied with electric power B+ at its input terminal.

The open state of the tact terminals 38 and 39 means that the rotary knob 32 is released from the pushing force. At this state, the microprocessor 10c is applied with no electric power.

In accordance with the second embodiment of the rotary encoder of FIG. 12, the rotary encoder itself is provided with the switching part, thereby removing a key (the recall/enter key), from the keyboard of the remote control unit and thus simplifying the construction of the remote control unit. Furthermore, this second embodiment facilitates the use of the recall/enter key, which is often used in controlling the volume as well as the menu, since the recall/enter key is located near the rotary encoder.

Figure 14:
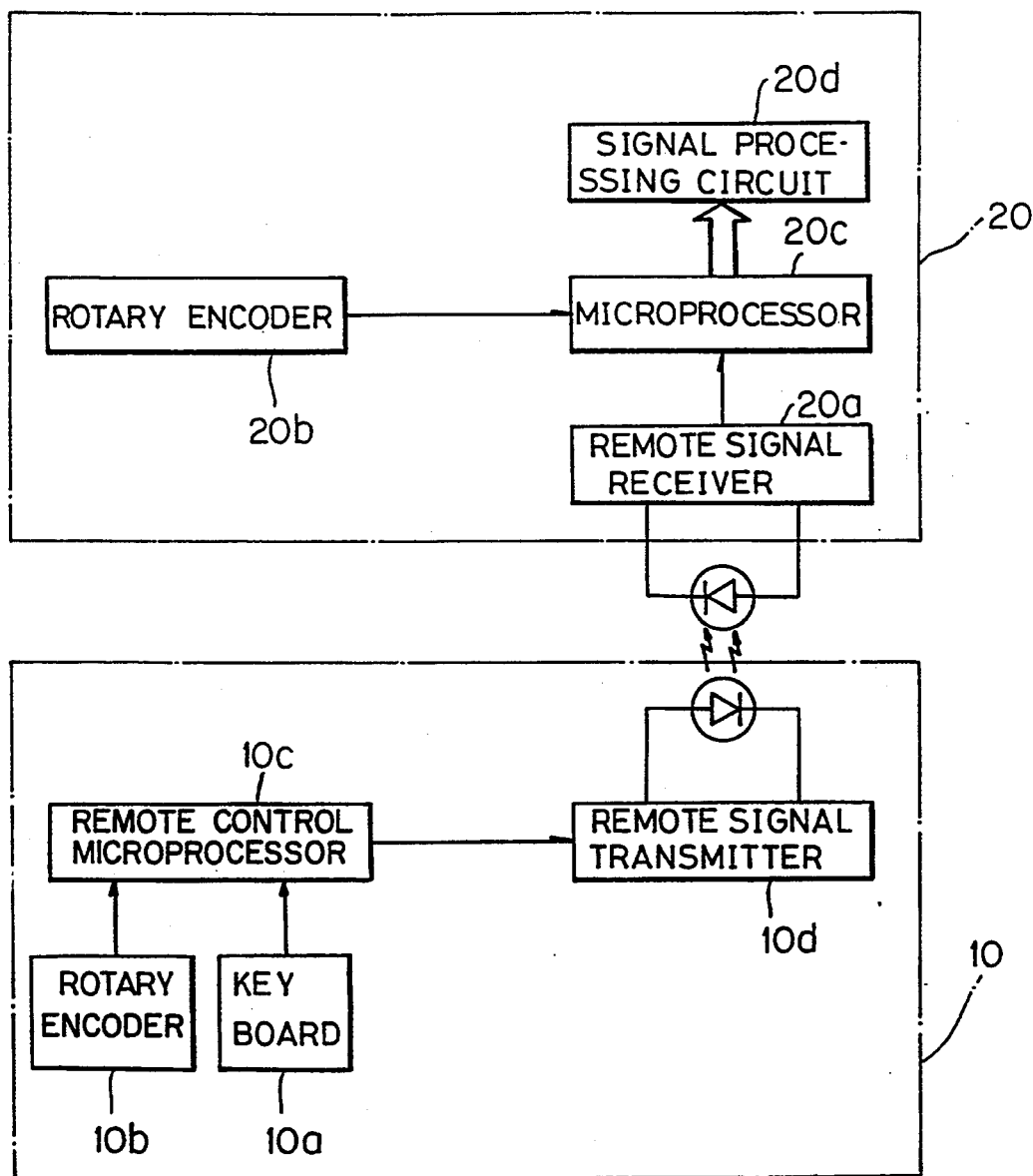
FIG. 14 is a block diagram of a remote controllable television unit and a remote control unit, provided with individual rotary encoders, according to still another embodiment of the present invention.

With reference to FIG. 14, there is shown a block diagram of a remote controllable television receiver unit 20 and a remote control unit 10, provided with individual rotary encoders 20b and 10b, according to a third embodiment of the present invention. The rotary encoder 20b is connected to the microprocessor 20c of the television receiver unit 20.

Figure 15A:
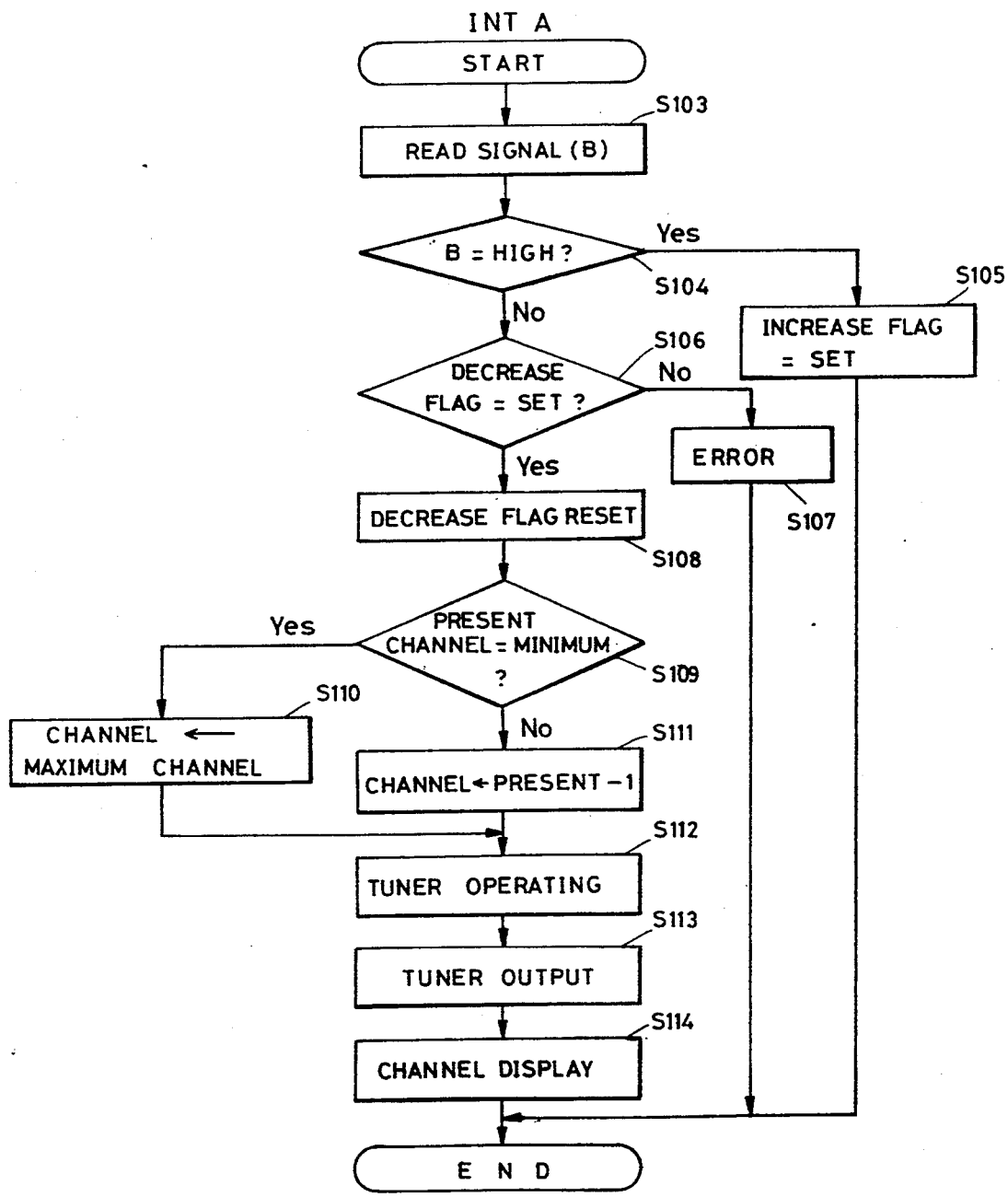
FIGS. 15A and 15B are flow diagrams of operations in accordance with the embodiment of FIG. 14, respectively.
Figure 15B:
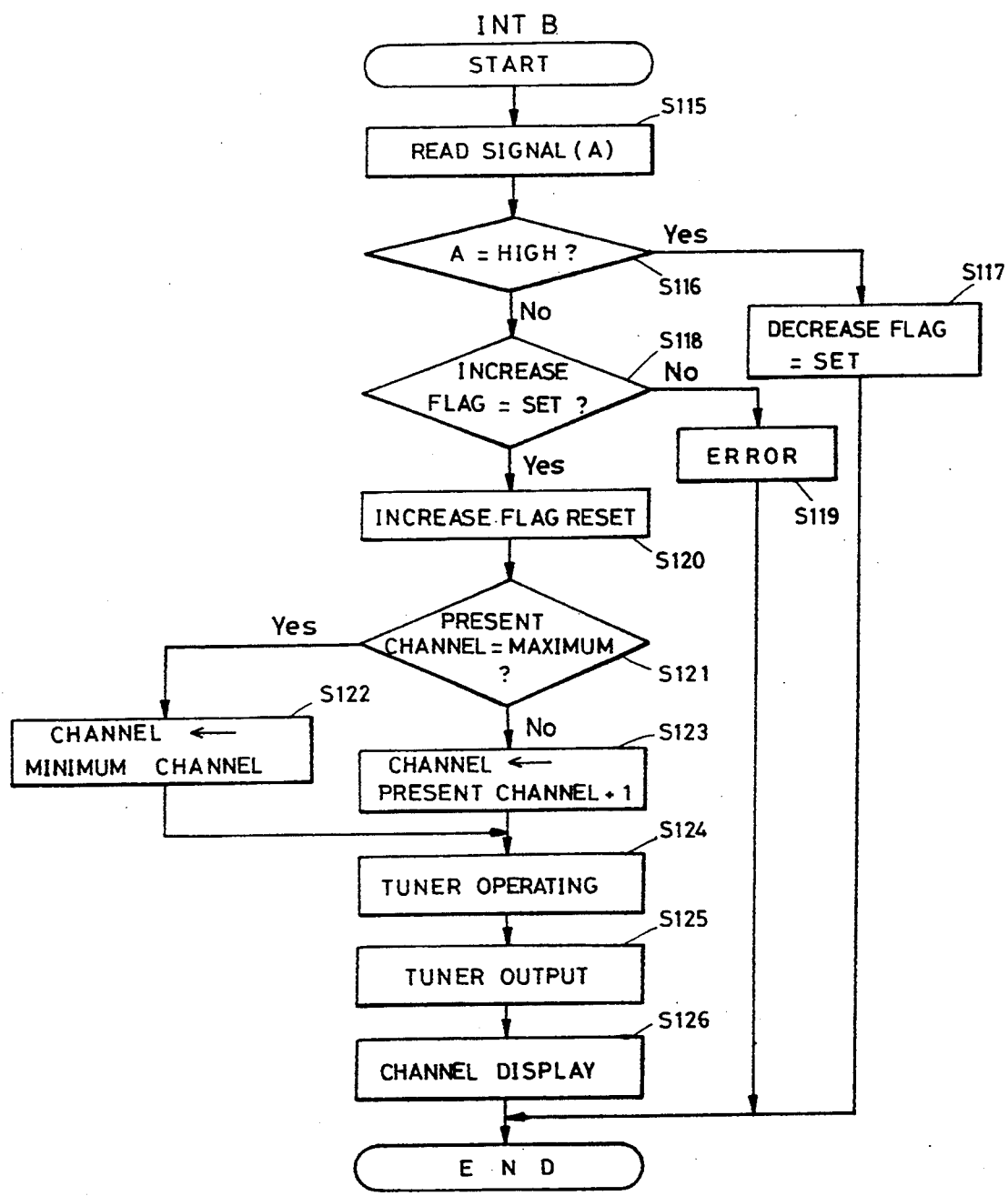

Turning to FIGS. 15A and 15B, there are shown flow diagrams of operations in accordance with the third embodiment of FIG. 14. In the third embodiment, the channel is increased or decreased in accordance with turning of the rotary encoder 20b.

In the same manner as described in FIG. 8A, when the input signal A has been applied to the interrupt terminal INT A, at steps $S_{103}$ and $S_{104}$ of FIG. 8A the input signal B applied to the interrupt terminal INT B is read and checked whether it is a high signal. When the input signal B is high the increase flag is set at step $S_{105}$ and the operation is ended. However, when the input signal B is, at step $S_{106}$ it is checked whether the decrease flag has been set.

When no decrease flag has been set, at step $S_{107}$ the signal is regarded as pulse caused by a noise and recognized as an error, and the operation is ended. However, when the decrease flag has been set, at a step $S_{108}$ the decrease flag is reset and at a step $S_{109}$ it is checked whether the present channel is the minimum channel.

When at the step $S_{109}$ it is determined that the present channel is the minimum channel, this means that there is no channel which can be decreased from the present channel, so that at a step $S_{110}$ the present channel is changed to the maximum channel. However, when the present channel is not the minimum channel, at a step $S_{111}$ the present channel is decreased by 1 step, and thereafter, at a step $S_{112}$ the tuner is operated and outputted, thereby causing the tuned channel to be displayed on the screen thereby allowing the user to easily recognize the tuned channel.

Turning to the flow diagram of FIG. 15B, when the input signal B has been applied to the interrupt terminal INT B, at steps $S_{115}$ and $S_{116}$ the input signal A applied to the interrupt terminal INT A is read and checked whether it is a high signal. When the input signal A is high, the decrease flag is set at a step $S_{117}$, and the operation is ended. However, when the input signal A is low signal, at a step $S_{118}$ it is checked whether the increase flag has been set. When no increase flag has been set, at step $S_{119}$ the input signal is regarded as a pulse caused by noise (i.e. recognized as an error) and the operation is ended.

However, when the increase flag has been set, at a step $S_{120}$ the increase flag is reset and at a step $S_{121}$ it is checked whether the present channel is the maximum channel. When at the step $S_{121}$ it is determined that the present channel is the maximum channel, this means that there is no channel which can be increased from the present channel, so that at a step $S_{122}$ the present channel is changed to the minimum channel. However, when the present channel is not the maximum channel, at a step $S_{123}$ the present channel is increased by 1 step, and thereafter, at a step $S_{124}$ the tuner is operated and outputted, thereby causing the tuned channel to be displayed on the screen.

As described above, the present invention facilitates channel selection and other functions of television receiver since they are simply performed by turning of a rotary encoder other than pushing of conventional various keys of the remote control unit. The conventional numeral keys can be thus removed from the remote control unit, thereby simplifying the construction of the remote control unit and facilitating the design of remote control unit. Furthermore, it is not necessary to provide a remote controller for the user in the case of selling a multi-functional television receiver. In accordance with the present invention, it is possible to provide to a user preferring to a rotary type television receiver with such a desired television receiver. Particularly in the present invention, two trigger pulse signals are outputted from the rotary encoder to a remote control microprocessor as the input signal for channel selection, so that it more efficiently prevents a faulty operation of the microprocessor due to noise in comparison with the prior art which use one trigger signal as the input signal.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A method for controlling a television receiver comprising the steps of:

(a) checking whether an input signal is a rotary encoder signal outputted from a rotary encoder;

(b) when said input signal is a rotary encoder signal, checking whether said input signal is an increase signal or a decrease signal and operating the television in accordance with said rotary encoder signal; and (c) when said input signal is not a rotary encoder signal, checking whether said input signal is a key signal, and, when said input signal is a key signal, operating the television in accordance with the corresponding key signal;

wherein step (b) further includes the sub steps of:

when a first input signal has been applied from said rotary encoder, reading a second input signal applied from said rotary encoder to a second interrupt terminal and when said second input signal is a high signal, setting an increase flag, and when said second input signal is a low signal, checking whether a decrease flag has been set and, when said decrease flag has been set, resetting said decrease flag and recognizing said second input signal as a decrease direction signal;

when said decrease flag has not been set, recognizing said second input signal as an erroneous signal;

and wherein, when said second input signal has been applied from said rotary encoder, reading said first input signal applied from said rotary encoder to a first interrupt terminal and checking whether said first input signal is a high signal or a low signal; and when said first input signal is a high signal, setting said decrease flag; and when said first input signal is a low signal, checking whether said increase flag has been set and, when said increase flag has been set, recognizing said first input signal as an increase directional signal, and when said increase flag has not been set, recognizing said first input signal as an erroneous signal.

* * * * *